(12) United States Patent
Lu et al.

(10) Patent No.: US 9,136,009 B1
(45) Date of Patent: Sep. 15, 2015

(54) METHOD TO IMPROVE ACCURACY OF A LOW VOLTAGE STATE IN FLASH MEMORY CELLS

(71) Applicant: MACRONIX International Co., Ltd., Hsinchu (TW)

(72) Inventors: Chi-Pei Lu, Hsinchu (TW); Guan-De Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 15 days.

(21) Appl. No.: 14/275,610

(22) Filed: May 12, 2014

(51) Int. Cl.
  *G11C 16/06* (2006.01)
  *G11C 16/34* (2006.01)
  *G11C 16/04* (2006.01)
  *G11C 16/14* (2006.01)

(52) U.S. Cl.
  CPC ........ *G11C 16/3404* (2013.01); *G11C 16/0408* (2013.01); *G11C 16/14* (2013.01)

(58) Field of Classification Search
  USPC ............. 365/185.22, 185.24, 185.26, 185.27, 365/185.29
  See application file for complete search history.

(56) References Cited

U.S. PATENT DOCUMENTS

| | | | | |
|---|---|---|---|---|
| 5,745,410 | A * | 4/1998 | Yiu et al. | 365/185.3 |
| 5,818,764 | A * | 10/1998 | Yiu et al. | 365/185.11 |
| 6,285,591 | B1 * | 9/2001 | Tanaka et al. | 365/185.22 |
| 8,120,960 | B2 * | 2/2012 | Varkony | 365/185.16 |

\* cited by examiner

*Primary Examiner* — Pho M Luu
(74) *Attorney, Agent, or Firm* — J.C. Patents

(57) ABSTRACT

A method to improve accuracy of a low voltage state in flash memory cells and the memory therewith is proposed. In the method, at least one memory cell is selected from among a plurality of memory cells in the non-volatile memory according to a first voltage and a second voltage. The first voltage is less than the second voltage and greater than or equal to an erase state voltage level of the flash memory, and the second voltage is less than or equal to a read voltage level of the flash memory. A recovery erase operation is applied to the at least one selected memory cell, thereby erasing electrical charges of the at least one selected memory cell to lower a threshold voltage of the at least one selected memory cell.

29 Claims, 8 Drawing Sheets

METHOD TO IMPROVE ACCURACY OF A LOW VOLTAGE STATE IN FLASH MEMORY CELLS

BACKGROUND OF THE INVENTION

1. Field of the Invention

The invention relates to a method for operation of a flash memory, and more particularly, to a method to improve accuracy of a low voltage state in flash memory cells.

2. Description of Related Art

A non-volatile memory, such as a flash memory, generally includes a stacked gate constituted by a floating gate and a control gate. A dielectric layer is placed between the floating gate and the control gate, and a tunnel oxide layer is located between the floating gate and a substrate. The floating gate is located between the substrate and the control gate, and is in a "floating" state (i.e., not electrically connecting to any circuits). The control gate is electrically connected to a word line. The floating gate is configured to store electrical charges, and the control gate is configured to control a data write/read operation. A memory cell with structure of the floating gate may be used as a single-bit or a multi-bit memory cell and so on.

It is required to add or remove the electrical charges limited in the floating gate during a program and erase operation to the memory cell of the flash memory, and characteristics of the memory cell in terms of reading, programming and erasing may be changed by such accumulation and removal of the electrical charges over time in said regions. Eventually, the accumulation of the electrical charges changes a threshold voltage for determining a state of the memory cell. Said problem is caused by a threshold voltage shift in the memory cell generally known as a disturbance phenomenon. Further, a charge loss of the memory cell after repeatedly cycling also leads to the threshold voltage shift (especially to a programming threshold voltage) and a performance degradation. Changes in the threshold voltage due the disturbance and/or the charge loss may affect a memory device in correctly sensing a bit state. Afore-said problem becomes even more notable when the memory cells are constantly scaled down and a distance between each two of the word lines gets too close.

In the program and erase operation of the flash memory, it is required to compare a value (e.g., a voltage level of a data bit) from a memory unit with a reference value, so as to determine each bit state (including a program state or an erase status) as stored in the single-bit or the multi-bit memory cell. Generally, during initial manufacturing period, a reference unit is pre-programmed and set to the erasing state for providing the reference value stably. When the value from the memory unit is greater than the reference value, it is determined that the memory unit is in the program state. On the other hand, when the value from the memory unit is less than the reference value, it is then determined that the memory unit is in the erase state.

FIG. 1 is a diagram illustrating a sensing window of a memory unit. A line 102 represents an ideal programming threshold voltage of the memory unit over time. A line 104 represents an example of the programming threshold voltage of the memory unit being changed over time and taken in consideration of the bit disturbance and the charge loss. A line 106 represents an ideal erasing threshold voltage of the memory unit over time. A line 108 represents an example of the erasing threshold voltage of the memory unit changed over time and taken in consideration of the bit disturbance and the charge loss. A line 110 represents a reference value provided by the reference unit of the memory device in conventional art, which is maintained at a constant value over time as shown in FIG. 1. Referring to FIG. 1, due to effects such as the bit disturbance and/or charge loss, a sensing window 112 between the reference value 110 and the programming threshold voltage 104 is reduced over time, and this may increase a possibility of sensing errors while lowering a reliability of the memory device.

In some applications, the erase operation must first be performed to the flash memory during the program operation. Such erase operation is mainly performed a cell array of the entire flash memory, individual blocks or a group of the memory cells. During the erase operation, an erase pulse is usually adopted to shift the threshold voltage of the memory cell to an erase target level. In some applications, after the erase pulse is applied, an erase verify operation is performed to verify whether the entire array, blocks, or the entire group of the memory cells are completely erased. The procedure of applying the erase pulse and performing the erase verify operation is constantly performed until the entire erase procedure is completed. However, during the erase operation, a specific proportion of tail bits or stubborn bits are existed in the entire array, blocks or the entire group of memory cell, which cannot pass the erase verify operation after the erase pulse is applied. This situation will cause the time delayed to complete the erase operation.

With effects of the disturbance and the electrical charges accumulation, or other influences, the erasing threshold voltage of the memory cell may be changed over time. Changes of the threshold voltage over time may lead to a condition in which storage state of the memory cell cannot be determined in a read verify operation. In other case that more and more tail bits or the stubborn bits located in a high boundary of the low voltage threshold (LVT) state memory cells, it will cause the time be delayed to complete the erase operation. Such condition may be solved by increasing the operation window (including operation windows for the program and erase operation). Nevertheless, as the memory cell of the flash memory being constantly scaled down, or under multi-bit operations, said solution can no longer satisfies current demands.

SUMMARY OF THE INVENTION

The invention relates to a method to improve accuracy of a low voltage state in flash memory cells.

In one of exemplary embodiments, a method of lowering a threshold voltage of a memory adapted to a non-volatile memory is proposed. In the method, at least one memory cell is selected from among a plurality of memory cells in the non-volatile memory according to a first voltage and a second voltage. The first voltage is less than the second voltage and greater than or equal to an erase state voltage level of the non-volatile memory, and the second voltage is less than or equal to a read voltage level of the non-volatile memory. A recovery erase operation is applied to the at least one selected memory cell, thereby erasing electrical charges of the at least one selected memory cell to lower a threshold voltage of the at least one selected memory cell.

In one embodiment, in the step of selecting the at least one memory cell, a threshold voltage detection is performed on all memory cells in an erase state in the non-volatile memory. After detection, one or more memory cells having the threshold voltage being greater than the first voltage and less than the second voltage as the at least one selected memory cell are selected therefrom.

In one embodiment, the first voltage is adjusted according to a quantity of the memory cells having the threshold voltage greater than the first voltage.

In one embodiment, in the recovery erase operation, a first gate voltage is applied to a gate of the at least one selected memory cell and a first drain voltage is applied to a drain of the at least one selected memory cell, thereby erasing the electrical charges of the gate of the at least one selected memory cell and lowering the threshold voltage of the at least one selected memory cell.

In one embodiment, the method of erasing the electrical charges of the gate of the at least one selected memory cell comprises injecting an electron hole to a floating gate of the gate by using a band-to-band tunneling hot hole injection (BBHHI) or a FN-tunneling hole injection.

In one embodiment, in the recovery erase operation, for other memory cells which are non-selected among the memory cells of the non-volatile memory, a second gate voltage is applied to the gate of a part of the other memory cells on the same word line with the at least one selected memory cell, and the first drain voltage is applied to the drain of the part of the other memory cells on the same word line with the at least one selected memory cell. The first gate voltage is applied to the gate of a part of the other memory cells on the same bit line with the at least one selected memory cell, and a second drain voltage is applied to the drain of the part of the other memory cells on the same bit line with the at least one selected memory cell, where the second gate voltage and the second drain voltage do not affect states of the other memory cells.

In other embodiment, in the step of selecting the at least one memory cell, a program/erase operation is applied to the memory cells of the non-volatile memory. A threshold voltage detection is applied to the memory cells, and one or more memory cells having the threshold voltage being greater than the first voltage and less than the second voltage as the at least one selected memory cell are selected therefrom.

In one embodiment, the recovery erase operation is repeated until the threshold voltage of each of the at least one selected memory cell is lower than the erase state voltage level of the non-volatile memory.

In one embodiment, the non-volatile memory is a NOR-type flash memory, a split gate structure memory, a floating gate memory, a nitride read only memory, a Nanocrystal memory, a parallel flash memory, or a serial peripheral interface (SPI) flash memory.

In one of exemplary embodiments, a method of erasing a non-volatile memory is proposed. In the method, a program/erase operation is applied to a plurality of memory cells of the non-volatile memory. A threshold voltage detection is performed to the memory cells to define at least one or a part of the memory cells having the threshold voltage greater than a first voltage and less than a second voltage as at least one selected memory cell, and the first voltage being less than the second voltage and greater than or equal to an erase state voltage level of the non-volatile memory. A recovery erase operation is applied to the at least one selected memory cell to lower the threshold voltage of the at least one selected memory cell. The recovery erase operation is repeated until the threshold voltage of each of the at least one selected memory cell is lower than the erase state voltage level of the non-volatile memory.

In one embodiment, the recovery erase operation to the at least one selected memory cell according to a quantity of the at least one selected memory cell.

In one embodiment, the erase state voltage level is a standard erase voltage of the non-volatile memory, and the second voltage is less than or equal to a read voltage of the non-volatile memory.

In one embodiment, the first voltage is adjusted according to a quantity of the memory cells having the threshold voltage greater than the first voltage.

In one embodiment, in the recovery erase operation, a first gate voltage is applied to a gate of the at least one selected memory cell and a first drain voltage is applied to a drain of the at least one selected memory cell, thereby erasing the electrical charges of the gate of the at least one selected memory cell and lowering the threshold voltage of the at least one selected memory cell.

In one embodiment, the method of erasing the electrical charges of the gate of the at least one selected memory cell comprises injecting an electron hole to a floating gate of the gate by using a band-to-band tunneling hot hole injection (BBHHI) or a FN-tunneling hole injection.

In one embodiment, in the recovery erase operation, for other memory cells which are non-selected among the memory cells of the non-volatile memory, a second gate voltage is applied to the gate of a part of the other memory cells on the same word line with the at least one selected memory cell, and the first drain voltage is applied to the drain of the part of the other memory cells on the same word line with the at least one selected memory cell. The first gate voltage is applied to the gate of a part of the other memory cells on the same bit line with the at least one selected memory cell, and a second drain voltage is applied to the drain of the part of the other memory cells on the same bit line with the at least one selected memory cell, where the second gate voltage and the second drain voltage do not affect states of the other memory cells.

In one embodiment, the non-volatile memory is a NOR-type flash memory, a split gate structure memory, a floating gate memory, a nitride read only memory, a Nanocrystal memory, a parallel flash memory, or a serial peripheral interface (SPI) flash memory.

In one of exemplary embodiments, a non-volatile memory is proposed. The non-volatile memory comprises a plurality of memory cells and a circuit. Each of the memory cells comprises a gate, and a source and a gate located in a substrate. The circuit electrically is coupled to the memory cells, and is configured to execute a program/erase operation and a recovery erase operation to the memory cells. After the program/erase operation is performed to the memory cells, a threshold voltage detection is performed by the circuit according to the memory cells in an erase state to select at least one or a part of the memory cells having the threshold voltage greater than an erase state voltage level to be defined as at least one selected memory cell. A recovery erase operation by the circuit is applied to the at least one selected memory cell to make the memory cells passing a verify procedure of the program/erase operation.

In one embodiment, the recovery erase operation comprises erasing the electrical charges of the gate of the at least one selected memory cell. In one embodiment, erasing the electrical charges of the gate of the at least one selected memory cell comprises injecting electron holes to a floating gate of the gate by using a band-to-band tunneling hot hole injection (BBHHI) or a FN-tunneling hole injection.

In one embodiment, the non-volatile memory further comprises a voltage generator, controlled by the circuit to generate a first gate voltage and a first drain voltage. The recovery erase operation executed by the circuit comprises applying the first gate voltage to the gate of the at least one selected memory cell and applying the first drain voltage to the drain of the at least one selected memory cell, thereby erasing electrical charges of the gate of the at least one selected memory cell and lowering the threshold voltage of the at least one selected memory cell.

In one embodiment, the voltage generator controlled by the circuit generates a second gate voltage and a second drain voltage. In the recovery erase operation executed by the circuit further comprises, for other memory cells which are non-selected among the memory cells of the non-volatile memory, the second gate voltage is applied to the gate of a part of the other memory cells on the same word line with the at least one selected memory cell and the first drain voltage is applied to the drain of the part of the other memory cells on the same word line with the at least one selected memory cell. The first gate voltage is applied to the gate of a part of the other memory cells on the same bit line with the at least one selected memory cell, and the second drain voltage is applied to the drain of the part of the other memory cells on the same bit line with the at least one selected memory cell, wherein the second gate voltage and the second drain voltage do not affect states of the other memory cells.

In one embodiment, the plurality of memory cells are cells of a NOR-type flash memory, a split gate structure memory, a floating gate memory, a nitride read only memory, a Nanocrystal memory, a parallel flash memory, or a serial peripheral interface (SPI) flash memory.

DESCRIPTION OF THE EMBODIMENTS

Figure 1:
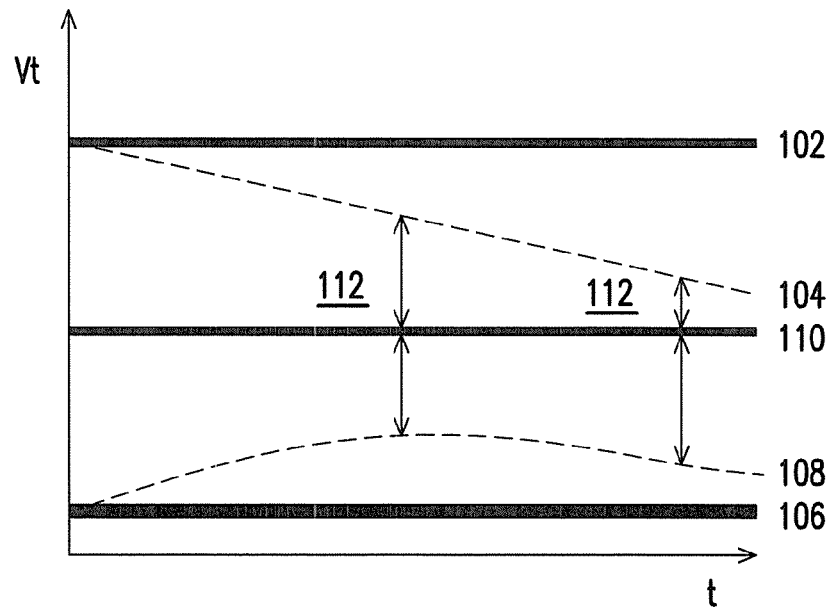
FIG. 1 is a diagram illustrating a sensing window of a memory unit.

A method and an architecture are proposed according to disclosure of the invention, for solving the problem of read fail induced by shifting of a threshold voltage level of the LVT state flash memory cells caused by the electrical charges gradually accumulated over time due to the phenomenon, or the problem of tail bits or stubborn bits during erase operation on the flash memory.

The method and the architecture are capable of realizing a technology as disclosed in the invention by simply adjusting operations in the existing architecture without necessity of changing the existing physical structure. Because the method and the architecture are proposed by adopting independent architecture, an erase operation may be performed specifically for one or a specific portion of memory cell having the tail bits or the stubborn bits. Therefore, a method of performing the erase operation for the single-bit or multi-bit memory cell may then be realized.

In an embodiment, the erase operation generally adopts a Fowler-Nordheim tunneling (FN-tunneling) technology. For a selected memory, a relatively high negative voltage (e.g., −5V to −15V) is applied to the control gate, and a relatively low positive voltage (e.g., +5V to +15V) is applied to a P-well interface (a base or a drain), so as to trigger the Fowler-Nordheim tunneling effect for erasing the electrical charges. It is required to perform the erase operation simultaneously to, the individual blocks or the group of memory cells, and those memory cells are usually referred to as an operation unit. Generally, the erase operation may be performed simultaneously to millions of the memory cells. During the erase operation, the erase pulse is usually utilized to shift the threshold voltage of the memory cell to the erase target level, and the erase verify operation is performed to verify whether the memory cells are completely erased. Therefore, the procedure of applying the erase pulse and performing the erase verify operation is constantly performed until the entire erase procedure is completed.

Accordingly, a part of the memory cell having the tail bits or the stubborn bits may lead to delay in overall operations. With the electrical charges accumulated over time, when the memory cell having the tail bits or the stubborn bits are operated in the future, the read fail may occur when the threshold voltage level is higher than a read level due to increases in the threshold voltage level. Positions of the memory cell having the tail bits or the stubborn bits may be identified in a scanning procedure of the erase verify operation. For instance, after the erase pulse has been applied once or several times, the memory cell still having the threshold voltage greater than a verify voltage (verify Vt) may be identified and found. The memory cells may be considered as having problems in the bit state, and marked as needing for a recovery erase operation, so as to accelerate speed and improve efficiency in the erase operation for the operation unit.

In an embodiment disclosed in the invention, a method and architecture of selectively performing a recovery erase operation to the specific memory cell in an erase procedure is provided. The method of selectively performing the recovery erase operation is perform to the specific memory cell (e.g., the memory cell considered as having the tail bits or the stubborn bits in the erase procedure, or the memory cell still not passing the erase verify operation after the erase pulse is applied once or several times).

In an embodiment, the method of selectively performing the recovery erase operation to the specific memory cell as proposed in the embodiment of the invention adopts two verify threshold voltages, so as to identify the memory cell having the tail bits or the stubborn bits during the program and erase operation. For the memory cell having the tail bits or the stubborn bits obtained after the identification, a relatively high negative voltage (−Vg) is applied to the control gate and a positive voltage (Vd) is applied to the drain, such that the electrical charges may be erased through a Band to Band Hot Hole Injection (BBHHI) or a FN-Tunneling mechanism to selectively and separately lower the threshold voltage for the specific memory cell. In the method of selectively performing the recovery erase operation to the specific memory cell of the present embodiment, the threshold voltage of the memory cell may be lowered to reduce possible risks of the read fail due to the threshold voltage shift of the specific memory cell (e.g., the memory cell having the tail bits or the stubborn bits).

When the recovery erase operation is selectively performed to the specific memory cell in the present embodiment, the negative voltage (-Vg) applied to the control gate may be as large as possible. However, an influence from the F-N tunneling (e.g., an electric field less than 10 million V/cm) in programming non-selected memory cells on the same word line must be avoided. The positive voltage (Vd) applied to the drain may also be as large as possible. However, a junction breakdown must be avoided, and an influence from a column stress caused by high drain voltage to the non-selected memory cells must also be taken in consideration.

The method of selectively performing the recovery erase operation to the specific memory cell in an erase procedure is described below according to the embodiments disclosed in the invention by reference with the drawings, but the invention is not limited thereto.

Figure 2A:
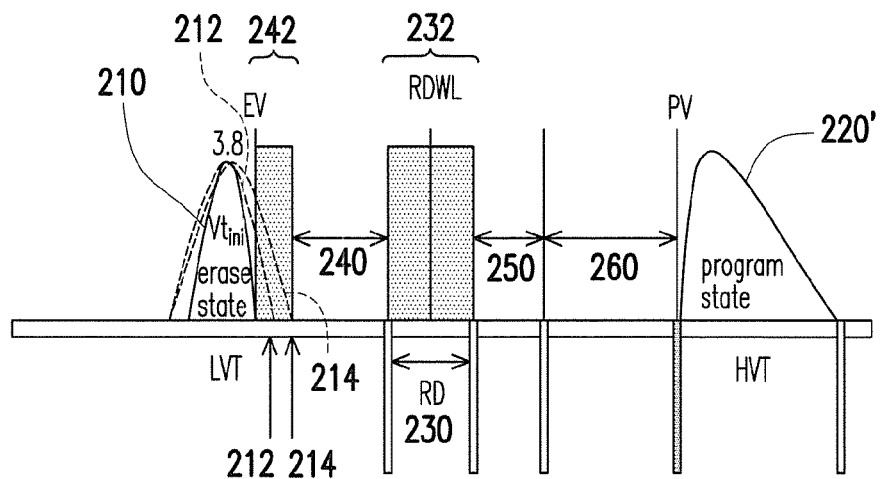
FIGS. 2A and 2B are distribution diagrams schematically illustrating two verify threshold voltage values adopted as a range for selecting the memory cell having the tail bits and the stubborn bits according the embodiments disclosed in the invention.
Figure 2B:
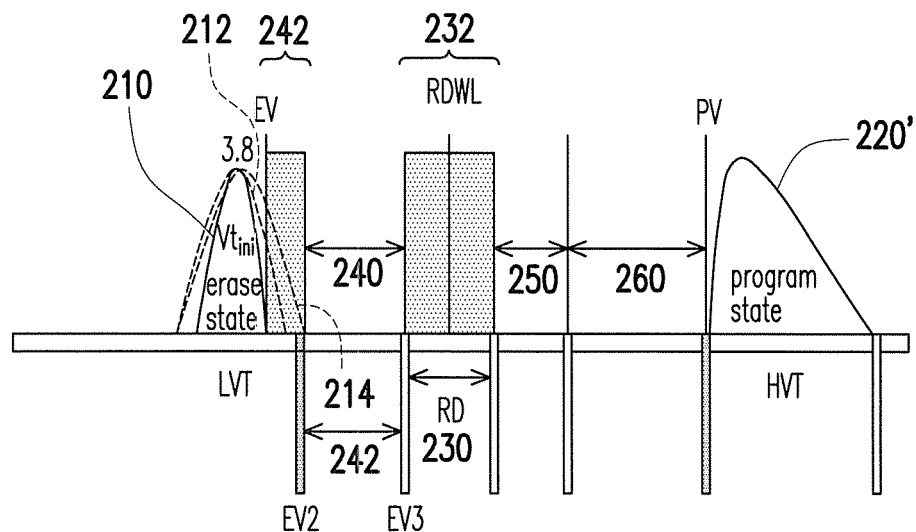

Referring to FIGS. 2A and 2B, which are distribution diagrams illustrating the two verify threshold voltage values adopted as a range for selecting the memory cell having the tail bits and the stubborn bits according the embodiments disclosed in the invention. In an embodiment, the method of selectively performing the recovery erase operation to the specific memory cell adopts two verify threshold voltage values to identify the memory cell having the tail bits or the stubborn bits during the program and erase operation.

Referring to FIG. 2A, this distribution diagram includes a low threshold voltage (LVT) region of the memory cell in erase state, a high threshold voltage (HVT) region of the memory cell in the program state, and a read region (RD) 230. PV, EV and RWL in the drawing are, respectively, a standard program voltage (PV), a standard erase voltage (EV) and a standard read voltage (RDWL), and the standard read voltage falls between the standard program voltage and the standard erase voltage. A region 240 indicates a difference between the read region (RD) 230 and the low threshold voltage (LVT) region, which is provided in consideration of the risks of the read fail due to the time, the program/erase cycling operation and a retention after cycling operation. A design margin is to maintain a specific difference away from a distribution of the threshold voltage of the memory cells in the erase state. Region 250 and 260 are provided between the read region 230 and the high threshold voltage HVT region, in which the region 250 is provided in consideration of factor of the retention after cycling over time, and the region 260 is provided in consideration of the disturbance phenomenon in the program state. A size of said design margin is also provided in consideration of a condition in which a gradient of either an initial erase state or an initial program state is greatly different from a gradient of the erase state and the program state for cycling over 10 thousand times, and such condition may lower a swing performance thereby affecting the overall operations, a cycle endurance, and a data retention of the memory unit.

In the low threshold voltage LVT region, a label 210 represents a distribution diagram of initial threshold voltage of the memory cell. The threshold voltage for determining the memory cell state is changed over time and/or after the program/erase cycling operation. After counting, a distribution state of the threshold voltage is obtained as shown by labels 212 and 214. The threshold voltage of the memory cell having the tail bits and the stubborn bits is distributed in the region 242. A size of the region 242 is decided according to a quantity of the memory cell having the tail bits and the stubborn bits. Due to time or influences by the other interference factors, the difference between the read region (RD) 230 and the low threshold voltage LVT region (the region 240) may be reduced to increase the risks of the read fail. A distribution state of the threshold voltage of the memory cells in the high voltage HVT region is as shown by a label 220.

Referring to FIG. 2B, as one of the embodiments, the two verify threshold voltage values adopted for identifying the memory cell having the tail bits or the stubborn bits in the embodiment disclosed in the invention may be any voltage values that falls within a range between a voltage value greater than or equal to the standard read voltage (EV) and a voltage value less than the standard read voltage (RDWL). For instance, they can be a voltage value EV2 at an edge of the region 242 and a voltage value EV3 at an edge the read region (RD) 230 in the drawing. An intensity of the voltage value EV2 at the edge of the region 242 may be designed or adjusted according to the tail bits being counted, or bits at a high voltage edge of the low threshold voltage LVT region, or according to the quantity of the memory cell having the stubborn bits having the threshold voltage that cannot be adjusted downwardly. In said adjusting mechanism, the quantity of the memory cell having the tail bits or the stubborn bits may be preset to a threshold, or may be adjusted according to a proportion of the quantity, and the invention is not limited thereto. In one embodiment, the voltage value EV2 and the voltage value EV3 may be respectively the standard read voltage (EV) and the standard read voltage (RDWL) of the flash memory.

Figure 3:
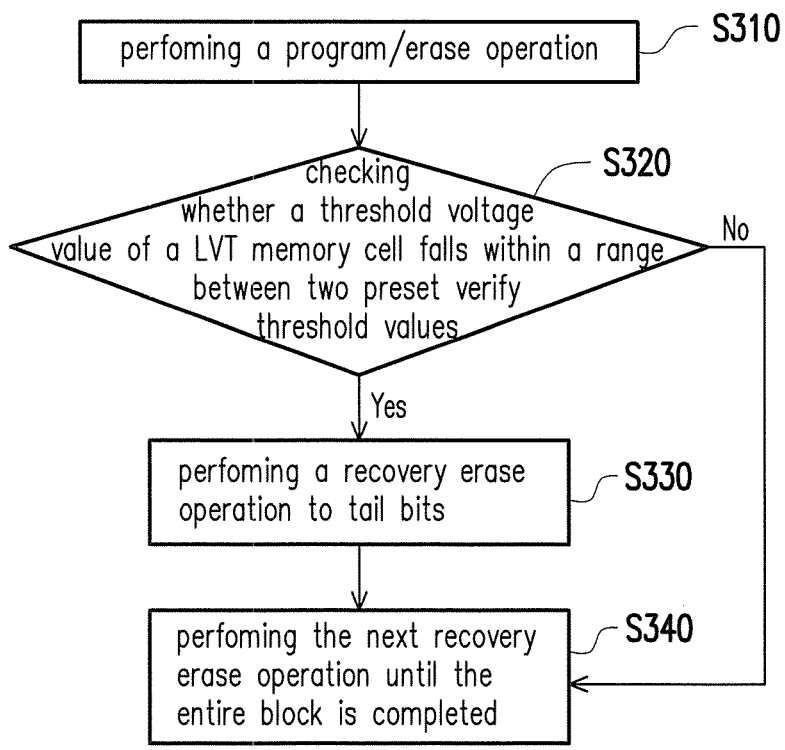
FIG. 3 schematically illustrates a flowchart of the method of selectively performing the recovery erase operation to the specific memory cell in one of the embodiments disclosed in the embodiment.

Referring to FIG. 3, which illustrates a flowchart of the method of selectively performing the recovery erase operation to the specific memory cell in one of the embodiments disclosed in the embodiment. When it comes to perform the program/erase operation to the memory cells of the flash memory, such erase operation is mainly performed on a cell array, individual blocks or a group of the memory cells in the entire flash memory. During the erase operation, in addition to the erase pulse applied for shifting the threshold voltage of the memory cell to the erase target level, the erase verify operation may also be performed to verify whether the entire array, block or the entire group of the memory cells are completely erased.

In the present embodiment, a process of scanning and selecting specific memory cell in order to perform the recovery erase operation includes the flowing steps, but the invention is not limited thereto. In step S310, a program/erase operation is performed to a memory cell. Meanwhile, as shown in step S320, whether the threshold voltage value of the memory cell falls within an range between the two verify threshold voltage values (e.g., the range between the voltage value EV2 at the edge of the low threshold voltage region and the voltage value EV3 at lower edge of the read region, as defined in FIG. 2B) is scanned or checked. If said threshold voltage value falls within such range, the recovery erase operation is performed to that memory cell which belongs to the tail bits. Thereafter, proceeding to step S340 which performs the program/erase operation to the next memory cell, and followed by executing steps S320 and S330 until the program/erase operation is performed to all the memory cells (e.g., the entire memory cell array, the entire block, or the entire group of the memory cells). In case the threshold voltage value of the memory cell does not fall within the range between the two verify threshold voltage values, directly proceeding to step S340 which performs the program/erase operation to the next memory cell, and followed by executing steps S320 and S330.

In the process of scanning and selecting the specific memory cell in order to perform the recovery erase operation as disclosed in the embodiment of the invention, the memory cell to which the recovery erase operation is performed may be found according to the two verify threshold voltage values being preset or dynamically set, and the erase operation may be performed to one or a specific part of the memory cells having the tail bits or the stubborn bits. Accordingly, the method of performing the erase operation to the single-bit or multi-bit memory cell may be realized to improve efficiency in overall operations while lowering the risks caused by the operation window being reduced in the erase operation.

Figure 4A:
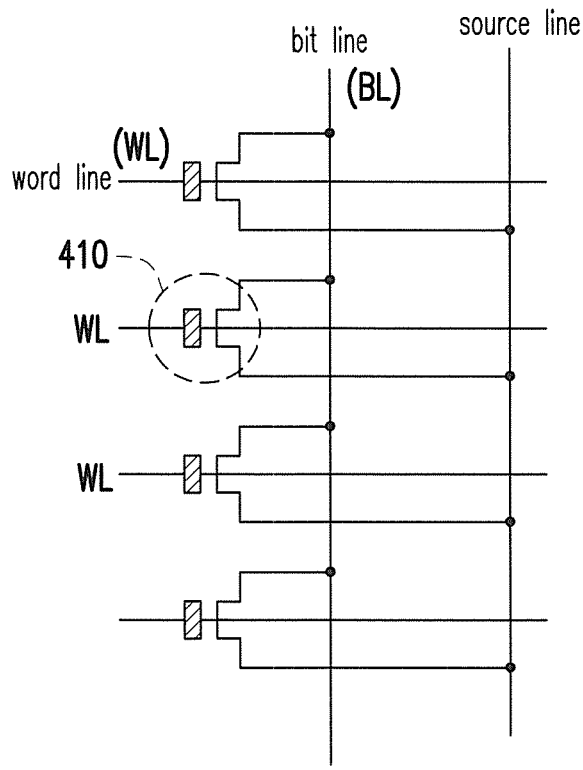
FIG. 4A to FIG. 4D are diagrams schematically illustrating the method of selectively performing the recovery erase operation to the specific memory cell according to one of the embodiments of the invention.

Referring to FIG. 4A to FIG. 4D, which are diagrams of the method of selectively performing the recovery erase operation to the specific memory cell according to one of the embodiments of the invention. As shown in FIG. 4A, a specific memory cell 410 has a control gate electrically connected to a word line (WL), a drain region electrically connected to a bit line (BL) and a source region electrically connected to a source line. In the memory array or the entire block, the control gate including the specific memory cell 410 and the control gate is also electrically connected to other memory cells on the same word line (WL). In the memory array or the entire block, the drain region including the specific memory cell 410 and the drain region is also electrically connected to other memory cells on the same bit line (BL).

For better illustration for the method of selectively performing the recovery erase operation to the specific memory cell, three types of memory cells are classified hereinafter, including the specific memory cell 410, a non-selected memory cell on the same bit line and a non-selected memory cell on the same word line. As described above, the quantity of the specific memory cell 410 selected for performing the recovery erase operation is not limited to only being one, and the specific memory cell may also be selected from the memory array or the entire block through the scanning and selecting procedure for performing the recovery erase operation. The method of performing the recovery erase operation to one or more specific memory cell may be performed by, for example, recording an address of the specific memory cell and locking it as a specific target by positioning through the word line (WL) and the bit line (BL).

Figure 4B:
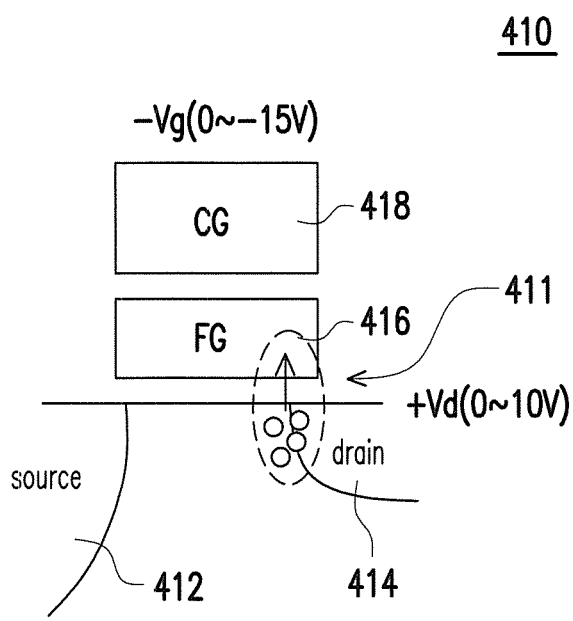

Referring to FIG. 4B, which is a cross-sectional diagram illustrating the recovery erase operation performed to the specific memory cell. The specific memory cell 410 includes a source region 412, a drain region 414, a floating gate (FG) 416 and a control gate (CG) 418. As described above, a dielectric layer is placed between the floating gate 416 and the control gate 418, and a tunnel oxide layer is located between the floating gate 416 and a substrate, thus related description is omitted hereinafter. For the specific memory cell 410, the recovery erase operation includes applying a negative voltage (−Vg; 0V to −15V) to the control (CG) 418, and applying the positive voltage (+Vd; 0V to 10V) to the drain region 414, so that the erase operation may be performed by injecting an electron hole 411 in the floating gate 416. Such method is capable of erasing the electrical charges while lowering the threshold voltage of the specific memory cell 410 by adopting a Band to Band Hot Hole Injection (BBHHI) method, a FN-tunneling hole injection or any other erase mechanisms.

Figure 4C:
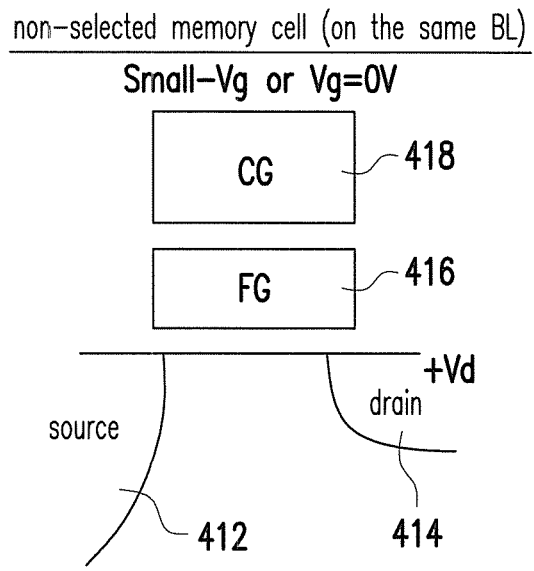
Figure 4D:
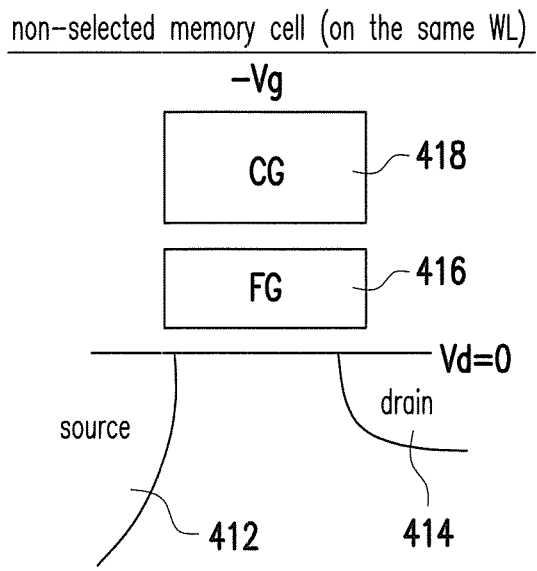

Referring to FIG. 4C, which is a cross-sectional diagram illustrating operations simultaneously performed on the non-selected memory cell on the same bit line (BL) while the recovery erase operation is performed to the specific memory cell. For the non-selected memory cell on the same bit line (BL), a real small negative voltage or a zero voltage is applied to the control gate (CG) 418, and the same positive voltage (+Vd; 0V to 10V) is applied to the drain region since these drain regions are on the same bit line with the specific memory cell. A selection of voltage values to the above is not particularly limited as long as the election hole is avoided from being injected to the floating gate 416. Referring to FIG. 4D, which is a cross-sectional diagram illustrating operations simultaneously performed on the non-selected memory cell on the same word line (WL) while the recovery erase operation is performed to the specific memory cell. For the non-selected memory cell on the same word line (WL), since the non-selected memory cell is on the same word line (WL) with the specific memory cell, the same negative voltage (−Vg; 0V to −15V) is applied to the control gate (CG) 418, and a zero voltage is applied to the drain region 414. A selection of voltage values to the above is not particularly limited as long as the election hole is avoided from being injected to the floating gate 416.

Figure 5A:
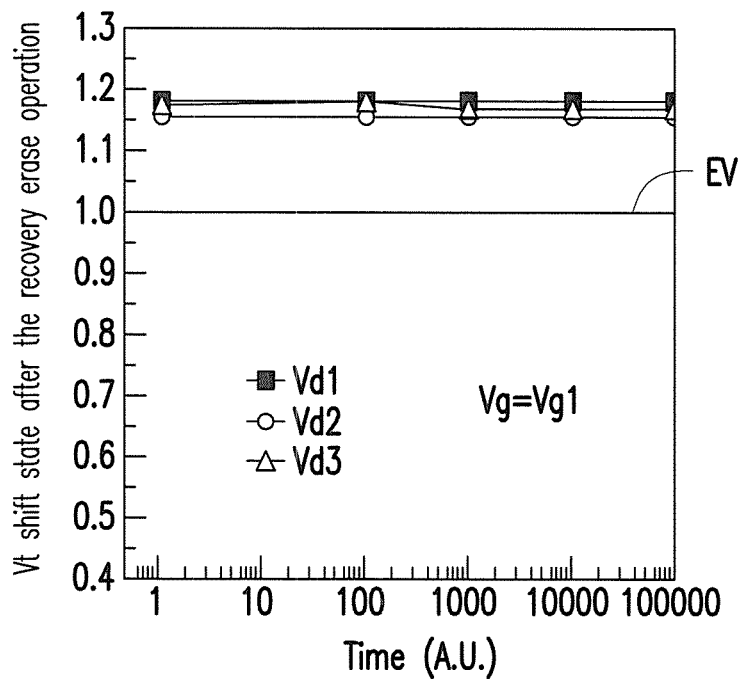
FIG. 5A to FIG. 5D are diagrams schematically illustrating results obtained after selectively performing the recovery erase operation to the specific memory cell by adopting different voltage values according to the disclosure of the invention.
Figure 5B:
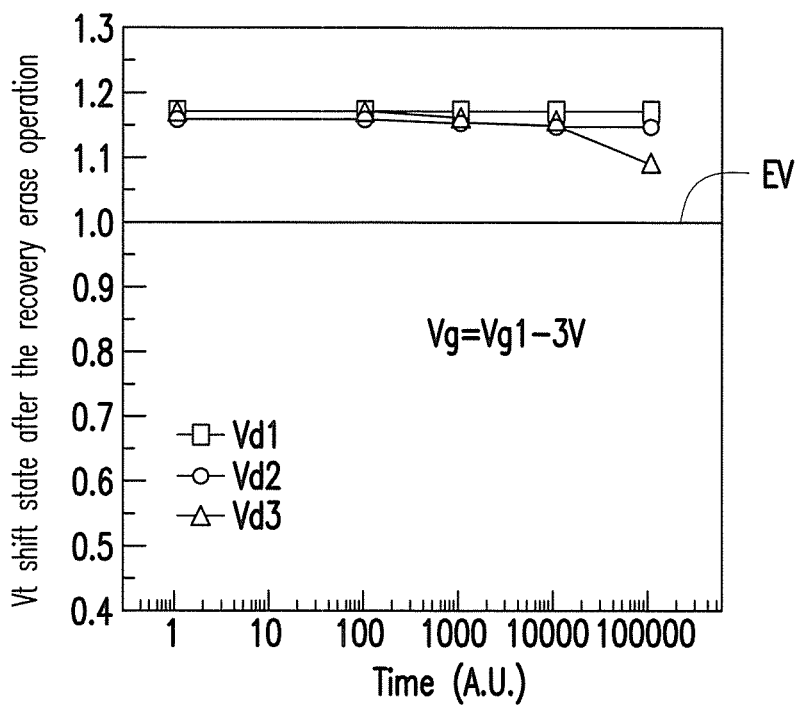
Figure 5C:
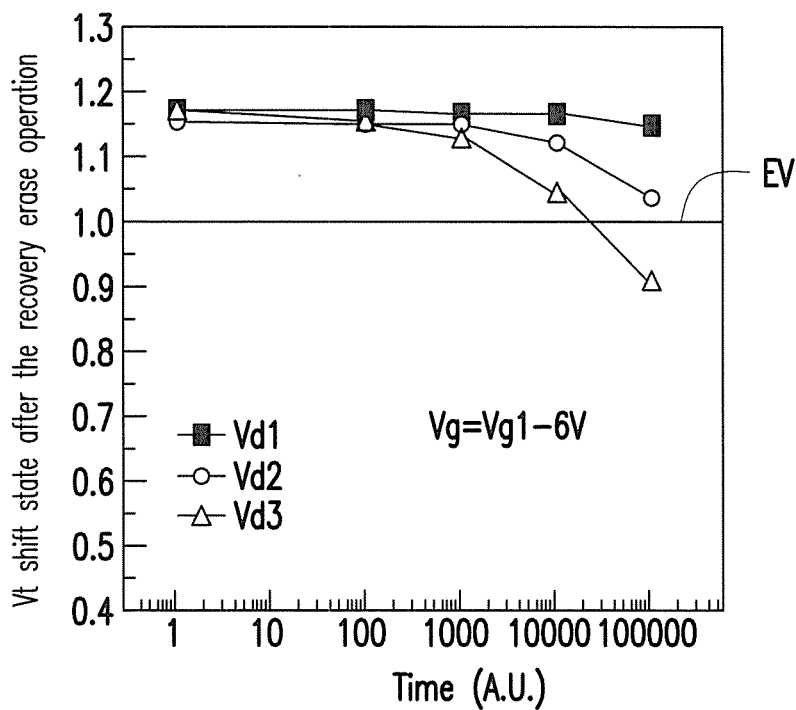
Figure 5D:
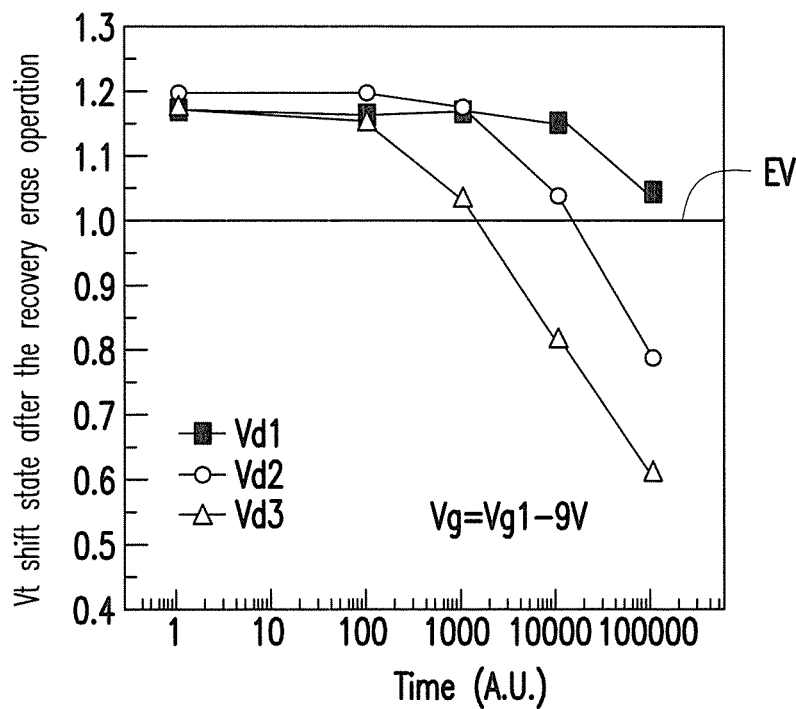

Referring to FIG. 5A to FIG. 5D, which are diagrams illustrating results obtained after selectively performing the recovery erase operation to the specific memory cell by adopting different voltage values according to the disclosure of the invention. FIG. 5A to FIG. 5D are diagrams with coordinates to indicate the threshold voltage shift state after the recovery erase operation and normalization times, respectively. The threshold voltage of the memory cell having the tail bits and the stubborn bits is higher than the standard erase voltage (EV). Referring to FIG. 5A, in case a first negative voltage (Vg1, in which Vg1<0) is applied to the control gate (CG) and different positive voltages (Vd1, Vd2 and Vd3, in which Vd1<Vd2<Vd3) are applied to the drain region, an effect thereof is not significant, and this indicates a condition in which the threshold voltage cannot be lowered by adopting a common erase operation. Referring to FIG. 5B, in case the voltage value applied to the control gate (CG) is reduced (e.g., Vg1 reduced by 3V; Vg1−3), after the different positive voltages (Vd1, Vd2 and Vd3) are applied to the drain region, the effect of lowering the threshold voltage value shows only at the coordinates where Vd3 is added to Vg1−3. Referring to FIG. 5C, if the voltage value applied to the control gate (CG) is further reduced (e.g., Vg1 reduced by 6V; Vg1−6), a part of threshold voltage values is lowered to be less than the standard erase voltage (EV) at the coordinates where Vd3 is added to Vg1−6. Referring to FIG. 5C, if the voltage value applied to the control gate (CG) is again further reduced (e.g., Vg1 reduced by 9V; Vg1−9), said effect is even more significant. However, the selection of a combination of the different voltage values needs to be taken in consideration of the influence or side effect caused by the non-selected memory cell on the same bit line or the word line.

Figure 6A:
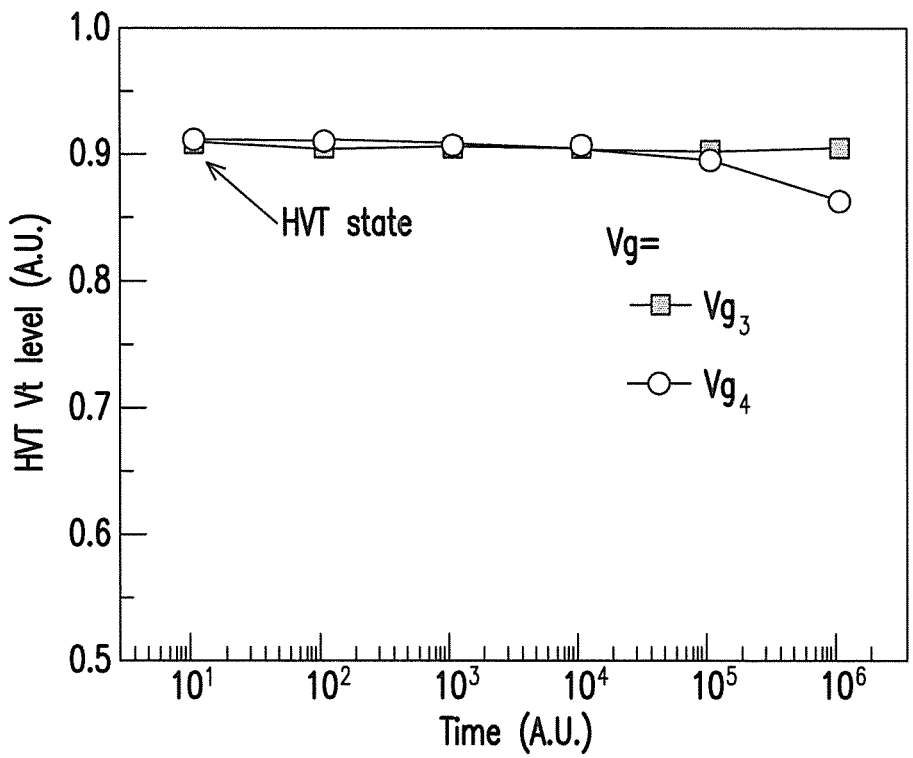
FIG. 6A is diagram schematically illustrating influence generated by applying an negative voltage to the control gate (CG) for the non-selected memory cell on the same word line while the recovery erase operation is performed to the specific memory cell.
Figure 6B:
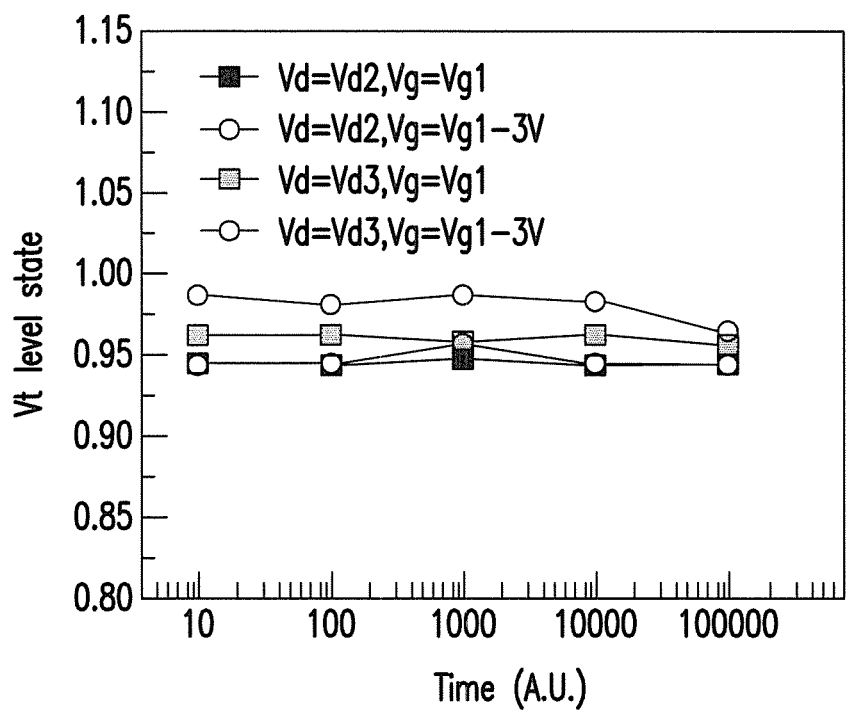
FIG. 6B and FIG. 6C are diagrams schematically illustrating respectively illustrates when the voltage is applied to the non-selected memory cell on the same bit line (BL) or on the same word line (WL).
Figure 6C:
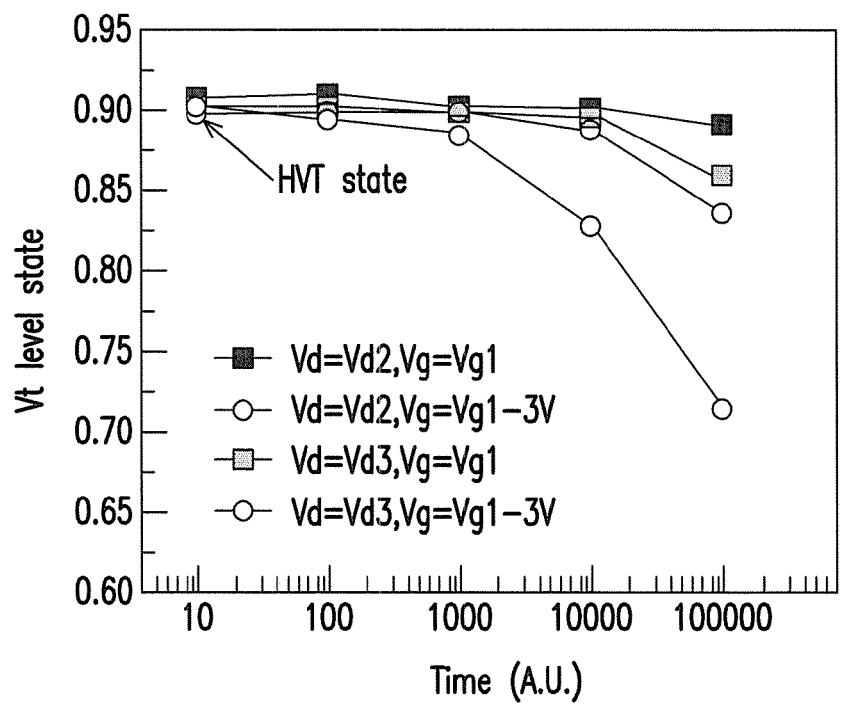

Referring to FIG. 6A, which illustrates influence generated by applying the negative voltage (−Vg; 0V to −15V) to the control gate (CG) for the non-selected memory cell on the same word line while the recovery erase operation is performed to the specific memory cell. For instance, when the negative voltage is −6V or −9V, Vg 3 or Vg4 in the drawing show no significant effects to the memory cell with high threshold voltage. Referring to FIG. 6B and FIG. 6C, when the same positive voltage is applied to the non-selected memory cell on the same bit line (BL), the different combinations of voltage values (Vg, Vd2), (Vg−3, Vd2), (Vg, Vd3), (Vg−3, Vd3) will not show significant effects to either the memory cell with the low threshold voltage value (FIG. 6B) or the memory cell with the high threshold voltage value (FIG. 6C). Aforesaid selection of the combination of the different voltage values may still be adjusted in consideration of the non-selected memory cell on the same bit line or the same word line.

A method and an architecture are proposed according to disclosure of the invention, for solving the problem of read fail induced by shifting of a threshold voltage level of the LVT state flash memory cells caused by the electrical charges gradually accumulated over time due to the phenomenon, or the problem of tail bits or stubborn bits during erase operation on the flash memory. In one embodiment, the aforesaid method and architecture proposed are adaptive to cells of a NOR-type flash memory, a split gate structure memory, a floating gate memory, a nitride read only memory, a Nanocrystal memory, a parallel flash memory, or a serial peripheral interface (SPI) flash memory.

Figure 7:
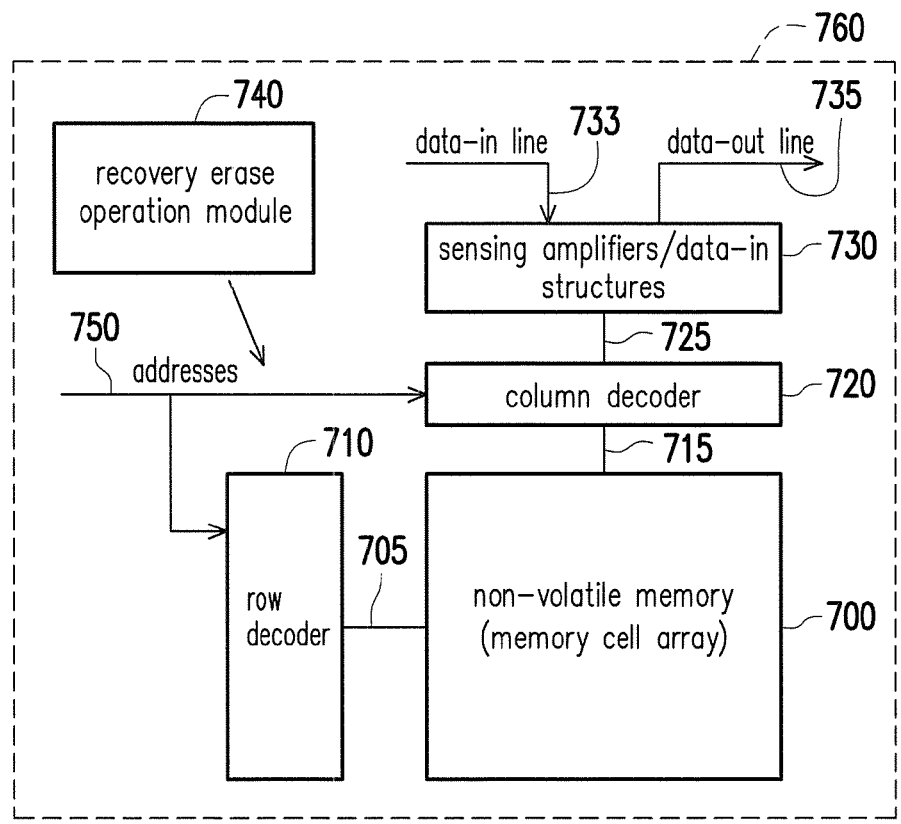
FIG. 7 is a simplified circuit block diagram of an integrated circuit as an application an embodiment of the embodiment.

FIG. 7 is a simplified circuit block diagram of an integrated circuit as an application an embodiment of the embodiment. A circuit 760 includes a non-volatile memory (a memory cell array) 700 located on a semiconductor substrate. A row decoder 710 is coupled to a plurality of word lines 705, and arranged along each row in the memory cell array 700. A column decoder 720 is coupled to a plurality of bit lines 715, in which the bit lines 715 are arranged along each column in the memory array 700, and configured to read and program data from multi-bits memory cells in the memory cell array 700. A bus 760 provides an address to the column decoder 720 and the row decoder 710. Sensing amplifiers and data-in structures in a block 730 are coupled to the column decoder 720 through a bus 725. Through a data-in line 733, the data are inputted to the data-in structures in the block 730 from an input/output port on the circuit, or from other internal or external data sources of the circuit 760. In the present embodiment, the circuit 760 may include other circuit such as a generic-purpose processor, a specific-purpose application circuit, or an integrated module supported by the non-volatile memory (the memory cell array). The data are outputted to the input/output port on the circuit 760 or an external data destination from the sense amplifiers in the block 730 through a data-out line 735. A recovery erase operation module 740 is configured to selectively perform an erase operation and an erase verify operation to the selected specific memory cell. Also, the recovery erase operation module 740 may be integrated with hardware architecture of an existing controller. Said controller is capable of operating logic circuit with specific purposes. In an alternative embodiment, said controller includes a generic-purpose processor for executing a computer program to control operations of the memory device. In yet another embodiment, said controller utilizes a combination of a specific-purpose logic circuit and a generic-purpose processor.

What is claimed is:

1. A method of lowering a threshold voltage of a memory, adapted to a non-volatile memory, the method comprising:
   from among a plurality of memory cells in the non-volatile memory, selecting at least one memory cell according to a first voltage and a second voltage, wherein the first voltage is less than the second voltage and greater than or equal to an erase state voltage level of the non-volatile memory, and the second voltage is less than or equal to a read voltage level of the non-volatile memory; and
   applying a recovery erase operation to the at least one selected memory cell, thereby erasing electrical charges of the at least one selected memory cell to lower a threshold voltage of the at least one selected memory cell.

2. The method of lowering the threshold voltage of the memory of claim 1, wherein the step of selecting the at least one memory cell comprises:
   performing a threshold voltage detection to all memory cells in an erase state in the non-volatile memory, and defining one or more memory cells having the threshold voltage being greater than the first voltage and less than the second voltage as the at least one selected memory cell.

3. The method of lowering the threshold voltage of the memory of claim 2, wherein the first voltage is adjusted according to a quantity of the memory cells having the threshold voltage greater than the first voltage.

4. The method of lowering the threshold voltage of the memory of claim 2, wherein the recovery erase operation comprises:
   applying a first gate voltage to a gate of the at least one selected memory cell and applying a first drain voltage to a drain of the at least one selected memory cell, thereby erasing the electrical charges of the gate of the at least one selected memory cell and lowering the threshold voltage of the at least one selected memory cell.

5. The method of lowering the threshold voltage of the memory of claim 4, wherein the method of erasing the electrical charges of the gate of the at least one selected memory cell comprises injecting an electron hole to a floating gate of the gate by using a band-to-band tunneling hot hole injection (BBHHI) or a FN-tunneling hole injection.

6. The method of lowering the threshold voltage of the memory of claim 4, wherein
   the first gate voltage is between 0V to −15V, and the first drain voltage is between 0V to 10V.

7. The method of lowering the threshold voltage of the memory of claim 4, wherein the recovery erase operation further comprises:
   for other memory cells which are non-selected among the memory cells of the non-volatile memory,
   applying a second gate voltage to the gate of a part of the other memory cells on the same word line with the at least one selected memory cell, and applying the first drain voltage to the drain of the part of the other memory cells on the same word line with the at least one selected memory cell,
   applying the first gate voltage to the gate of a part of the other memory cells on the same bit line with the at least one selected memory cell, and applying a second drain voltage to the drain of the part of the other memory cells on the same bit line with the at least one selected memory cell, wherein the second gate voltage and the second drain voltage do not affect states of the other memory cells.

8. The method of lowering the threshold voltage of the memory of claim 7, wherein
   the second gate voltage is approximately 0V or far less than the first gate voltage, and the second drain voltage is approximately 0V.

9. The method of lowering the threshold voltage of the memory of claim 1, wherein the step of selecting, the at least one memory cell comprises:
   performing a program/erase operation to the memory cells of the non-volatile memory; and
   performing a threshold voltage detection to the memory cells, and defining one or more memory cells having the threshold voltage being greater than the first voltage and less than the second voltage as the at least one selected memory cell.

10. The method of lowering the threshold voltage of the memory of claim 1, further comprising:
repeating the recovery erase operation until the threshold voltage of each of the at least one selected memory cell is lower than the erase state voltage level of the non-volatile memory.

11. The method of lowering the threshold voltage of the memory of claim 1, wherein the non-volatile memory is a NOR-type flash memory, a split gate structure memory, a floating gate memory, a nitride read only memory, a Nanocrystal memory, a parallel flash memory, or a serial peripheral interface (SPI) flash memory.

12. A method of erasing a non-volatile memory, comprising:
performing a program/erase operation to a plurality of memory cells of the non-volatile memory;
performing a threshold voltage detection to the memory cells to define at least one or a part of the memory cells having the threshold voltage greater than a first voltage and less than a second voltage as at least one selected memory cell, and the first voltage being less than the second voltage and greater than or equal to an erase state voltage level of the non-volatile memory;
applying a recovery erase operation to the at least one selected memory cell to lower the threshold voltage of the at least one selected memory cell; and
repeating the recovery erase operation until the threshold voltage of each of the at least one selected memory cell is lower than the erase state voltage level of the non-volatile memory.

13. The method of erasing the non-volatile memory of claim 12, further comprises applying the recovery erase operation to the at least one selected memory cell according to a quantity of the at least one selected memory cell.

14. The method of erasing the non-volatile memory of claim 12, wherein the erase state voltage level is a standard erase voltage of the non-volatile memory, and the second voltage is less than or equal to an read voltage of the non-volatile memory.

15. The method of erasing the non-volatile memory of claim 12, wherein the first voltage is adjusted according to a quantity of the memory cells having the threshold voltage greater than the first voltage.

16. The method of erasing the non-volatile memory of claim 12, wherein the recovery erase operation comprises:
applying a first gate voltage to a gate of the at least one selected memory cell and applying a first drain voltage to a drain of the at least one selected memory cell, thereby erasing the electrical charges of the gate of the at least one selected memory cell and lowering the threshold voltage of the at least one selected memory cell.

17. The method of erasing the non-volatile memory of claim 16, wherein the method of erasing the electrical charges of the gate of the at least one selected memory cell comprises injecting an electron hole to a floating gate of the gate by using a band-to-band tunneling hot hole injection (BBHHI) or a FN-tunneling hole injection.

18. The method of erasing the non-volatile memory of claim 16, wherein the first gate voltage is between 0V to −15V, and the first drain voltage is between 0V to 10V.

19. The method of erasing the non-volatile memory of claim 16, wherein the recovery erase operation further comprises:
for other memory cells which are non-selected among the memory cells of the non-volatile memory,
applying a second gate voltage to the gate of a part of the other memory cells on the same word line with the at least one selected memory cell, and applying the first drain voltage to the drain of the part of the other memory cells on the same word line with the at least one selected memory cell,
applying the first gate voltage to the gate of a part of the other memory cells on the same bit line with the at least one selected memory cell, and applying a second drain voltage to the drain of the part of the other memory cells on the same bit line with the at least one selected memory cell, wherein the second gate voltage and the second drain voltage do not affect states of the other memory cells.

20. The method of erasing the non-volatile memory of claim 19, wherein the second gate voltage is approximately 0V or far less than the first gate voltage, and the second drain voltage is approximately 0V.

21. The method of erasing the non-volatile memory of claim 12, wherein the non-volatile memory is a NOR-type flash memory, a split gate structure memory, a floating gate memory, a nitride read only memory, a Nanocrystal memory, a parallel flash memory, or a serial peripheral interface (SPI) flash memory.

22. A non-volatile memory, comprising:
a plurality of memory cells, wherein each of the memory cells comprises a gate, and a source and a gate located in a substrate; and
a circuit electrically coupled to the memory cells, and configured to execute a program/erase operation and a recovery erase operation to the memory cells, wherein after the program/erase operation is performed to the memory cells, a threshold voltage detection is performed according to the memory cells in an erase state to select at least one or a part of the memory cells having the threshold voltage greater than an erase state voltage level to be defined as at least one selected memory cell, a recovery erase operation is applied to the at least one selected memory cell to make the memory cells passing a verify procedure of the program/erase operation.

23. The non-volatile memory of claim 22, wherein the recovery erase operation comprises erasing the electrical charges of the gate of the at least one selected memory cell.

24. The non-volatile memory of claim 23, wherein erasing the electrical charges of the gate of the at least one selected memory cell comprises injecting electron holes to a floating gate of the gate by using a band-to-band tunneling hot hole injection (BBHHI) or a FN-tunneling hole injection.

25. The non-volatile memory of claim 22, further comprising:
a voltage generator, controlled by the circuit to generate a first gate voltage and a first drain voltage, wherein
the recovery erase operation executed by the circuit comprises applying the first gate voltage to the gate of the at least one selected memory cell and applying the first drain voltage to the drain of the at least one selected memory cell, thereby erasing electrical charges of the gate of the at least one selected memory cell and lowering the threshold voltage of the at least one selected memory cell.

26. The non-volatile memory of claim 25, wherein the first gate voltage is between 0V to −15V, and the first drain voltage is between 0V to 10V.

27. The non-volatile memory of claim 25, wherein the voltage generator controlled by the circuit generates a second gate voltage and a second drain voltage, wherein
the recovery erase operation executed by the circuit further comprises:

for other memory cells which are non-selected among the memory cells of the non-volatile memory, applying the second gate voltage to the gate of a part of the other memory cells on the same word line with the at least one selected memory cell, and applying the first drain voltage to the drain of the part of the other memory cells on the same word line with the at least one selected memory cell, applying the first gate voltage to the gate of a part of the other memory cells on the same bit line with the at least one selected memory cell, and applying the second drain voltage to the drain of the part of the other memory cells on the same bit line with the at least one selected memory cell, wherein the second gate voltage and the second drain voltage do not affect states of the other memory cells.

28. The non-volatile memory of claim 27, wherein the second gate voltage is approximately 0V or far less than the first gate voltage, and the second drain voltage is approximately 0V.

29. The non-volatile memory of claim 22, wherein the plurality of memory cells are cells of a NOR-type flash memory, a split gate structure memory, a floating gate memory, a nitride read only memory, a Nanocrystal memory, a parallel flash memory, or a serial peripheral interface (SPI) flash memory.

* * * * *